United States Patent [19]

Adkins

[11] Patent Number: 5,319,521
[45] Date of Patent: Jun. 7, 1994

[54] CERAMIC FRAMES AND CAPSULES FOR Z-AXIS MODULES

[75] Inventor: Larry R. Adkins, Tustin, Calif.

[73] Assignee: Rockwell International Corporation, Seal Beach, Calif.

[21] Appl. No.: 930,630

[22] Filed: Aug. 17, 1992

[51] Int. Cl.⁵ ............................................. H05K 7/20
[52] U.S. Cl. ................................. 361/707; 361/729; 361/761
[58] Field of Search ................. 29/840, 843, 412, 415; 174/16.3, 254; 357/81; 361/386–389, 393, 396, 401, 412, 414; 439/65; 437/218

[56] References Cited

U.S. PATENT DOCUMENTS

| | | | |
|---|---|---|---|
| 3,847,026 | 11/1974 | Boltinghouse et al. | 74/5.6 |
| 3,926,746 | 12/1975 | Hargis | 437/218 |
| 4,431,935 | 2/1984 | Rider | 310/331 |
| 4,744,008 | 5/1988 | Black et al. | 361/401 |
| 4,764,846 | 8/1988 | Go | 361/386 |
| 4,933,808 | 6/1990 | Horton et al. | 361/386 |
| 4,959,900 | 10/1990 | de Givry et al. | 361/388 |
| 4,982,311 | 1/1991 | Dehaine et al. | 361/401 |

FOREIGN PATENT DOCUMENTS

| | | | |
|---|---|---|---|
| 0248453 | 11/1986 | Japan | 437/218 |
| 0014454 | 1/1988 | Japan | 437/218 |
| 0016644 | 1/1988 | Japan | 437/218 |
| 0016645 | 1/1988 | Japan | 437/218 |
| 0081347 | 3/1989 | Japan | 437/218 |
| 0263458 | 10/1990 | Japan | 437/218 |

*Primary Examiner*—Gregory D. Thompson
*Attorney, Agent, or Firm*—H. Fredrick Hamann; George A. Montanye; Tom Streeter

[57] ABSTRACT

The CERAMIC FRAMES AND CAPSULES FOR Z-AXIS MODULES shown herein are formed by placing chips 10 into a ceramic frame 12, breaking apart the frame 12 into sub-frames 26, and bonding the sub-frames 26 into a module 30. The sub-frames 26 may be separated by ceramic sub-backings 28. Each sub-frame 26 and sub-backing 28 forms a capsule 22.

4 Claims, 3 Drawing Sheets

CERAMIC FRAMES AND CAPSULES FOR Z-AXIS MODULES

This invention was made with Government support under Contract No. DASG60-90-C-0136 awarded by the Army. The Government has certain rights in this invention.

BACKGROUND OF THE INVENTION

The present invention relates to Z-axis modules, and has particular relation to Z-axis modules which demonstrate reduced flexing, increased electrical isolation, and improved thermal conductivity.

Modern focal plane array technology requires not only that suitable detectors be located at the focal plane, but also that the signals detected by these detectors be processed immediately, both in space and time. A convenient method for accomplishing this is to stack a large plurality of integrated circuits, or chips, so that their edges directly connect with the detectors. The edge opposite the detector can then produce a processed signal.

Unfortunately, these chips are more flexible than is desired, which causes performance limitations. Further, existing mounting devices can provide insufficient electrical isolation of the chips from one another, and further can provide insufficient means for removing the heat generated by the chips.

SUMMARY OF THE INVENTION

It is an objective of the present invention to overcome these limitations of the prior art. This objective is accomplished by placing the chips into a ceramic frame, and bonding the frames together. The frames may be separated by ceramic backings.

DETAILED DESCRIPTION OF A PREFERRED EMBODIMENT

Figure 1:
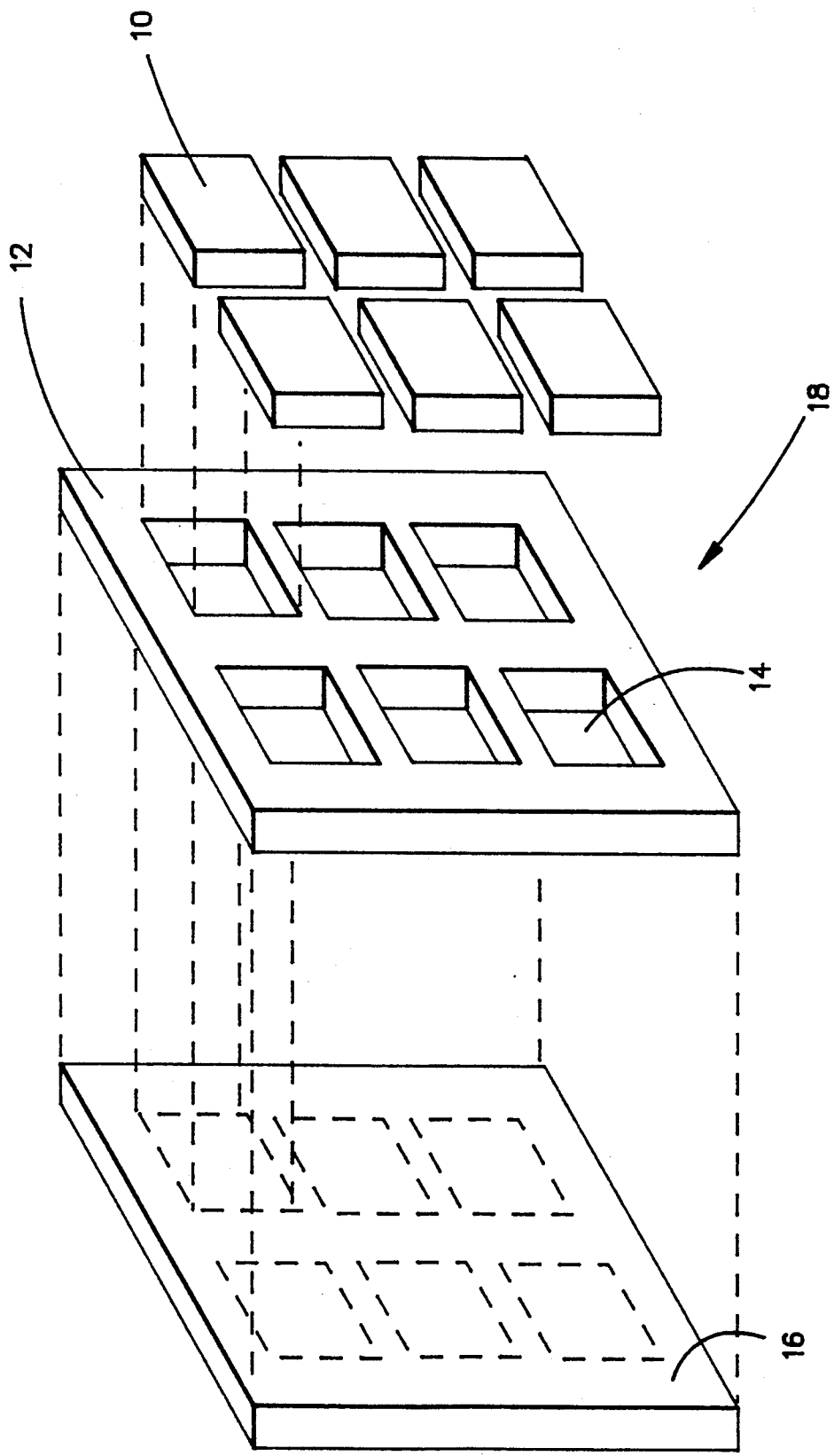
FIG. 1 is an exploded view of a chip-containing structure.

In FIG. 1, a plurality of chips 10 are placed into a frame 12, which has a like plurality of holes 14 previously cut into it. The frame 12 is made of a ceramic sheet, so as to provide additional rigidity, increased electrical isolation, and a closer match to the coefficient of thermal expansion of the chips 10. The holes 14 may be either cut into the frame 12 after it has been fired, or the frame 12 may be formed with the holes 14 already in it, before firing. The frame 12 is bonded to a backing 16. This bonding may take place either before or after the chips 10 have been placed in the frame 12, as the worker may find most convenient. The structure 18 includes the chips 10, frame 12, and backing 16, all in a single piece.

The backing 16, also made of a ceramic sheet with a similar coefficient of thermal expansion, is desirable when the chips 10 are electrically conductive on both sides, thereby causing undesirable electrical connections between the faces of adjoining chips 10. This will generally be the case when the chips 10 are heavily doped. When the chips 10 are less heavily doped on both sides, then the backing 16 may be omitted from the structure 18. This allows a greater density of chips 10. However, the backing 16 also acts as a means of extracting heat from, and provides additional rigidity, to the chips 10. The final decision as to whether to include a backing 16 in the structure 18 depends on the specific application at hand.

Figure 2:
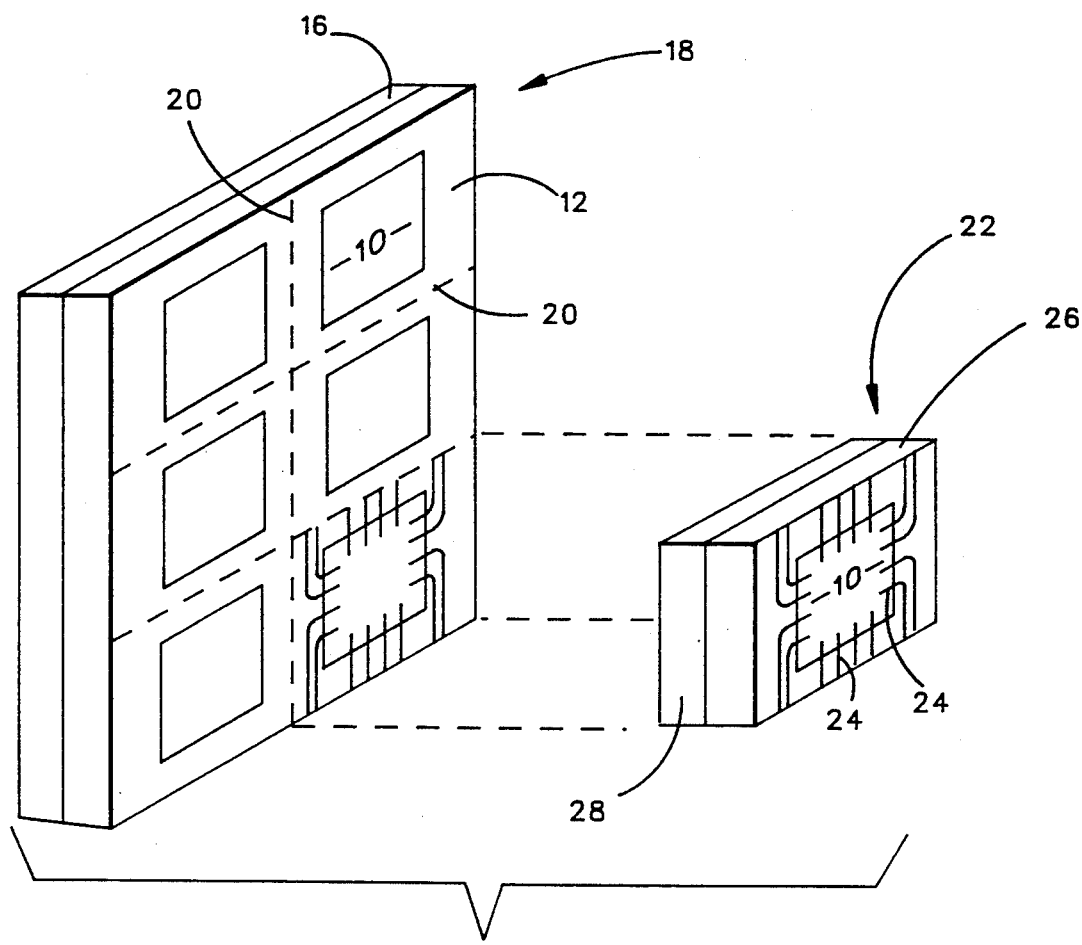
FIG. 2 shows a chip-containing capsule being divided out from the structure of FIG. 1.

In FIG. 2, the structure 18 is shown with score lines 20, along which the structure 18 may be divided into capsules 22, by scoring, sawing, or the like. Leads 24 are deposited on each capsule 22, connecting each chip 10 to its sub-frame 26. This deposition is preferably accomplished before the structure 18 is divided into capsules 22, to reduce labor costs. A sub-backing 28 is divided from the backing 16 when the structure 18 is divided into capsules 22. Input-output devices, forming no part of the present invention, may then be connected to the (robust) leads 24 rather than to the (fragile) chip 10.

Figure 3:
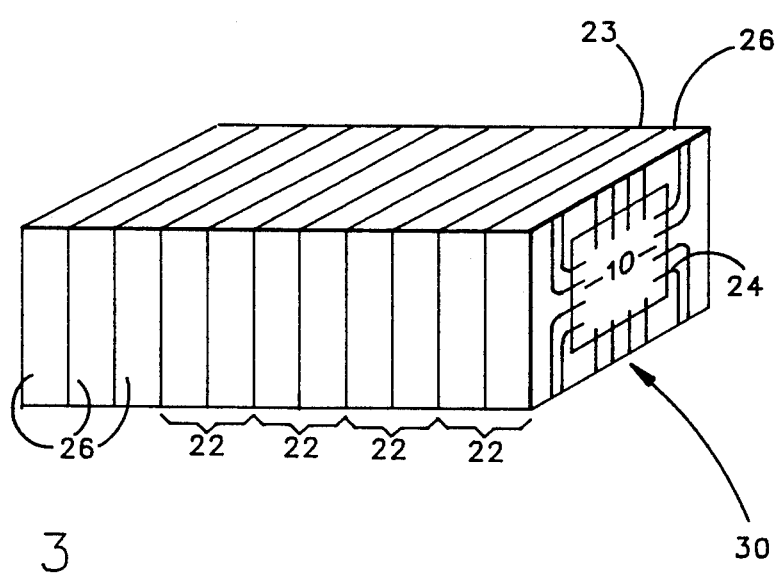
FIG. 3 shows an entire Z-axis module.

In FIG. 3, a plurality of capsules 22 have been bonded together into a Z-axis module 30. The module 30 also includes, for illustrative purposes, a plurality of sub-frames 26 not separated by sub-backings 28, since the chips 10 in these sub-frames 26 are sufficiently rigid, electrically isolated, and thermally conductive as to not require sub-backings 28. These chips 10 may therefore be packed more densely. The entire top surface of the Z-axis module 30 may now be interconnected to an array of focal plane detectors, receiving unprocessed signals from them and producing processed signals on the bottom surface of the module 30.

Figure 4:
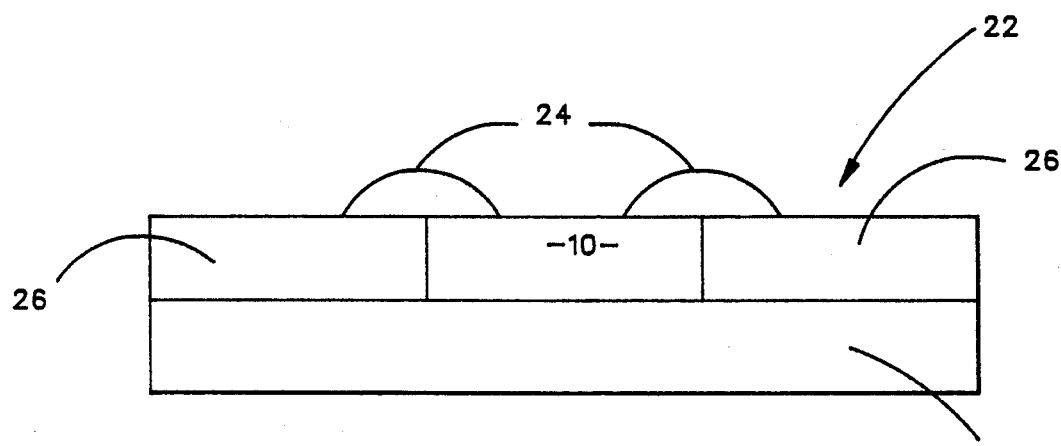
FIG. 4 is a cross section of a capsule using wire electrodes.
Figure 5:
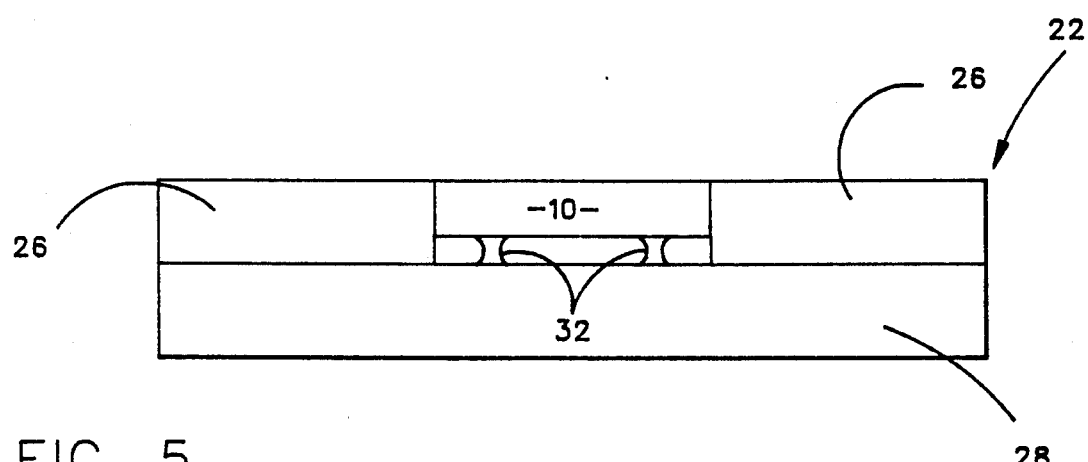
FIG. 5 shows a cross section of a capsule using bump electrodes.

FIG. 4 shows a cross section of a capsule 22, in which a chip 10 interfaces with the outside world through wire or planar electrodes 24. FIG. 5 shows the same chip 10 using bump electrodes 32, in the "flip chip" mode. The structure of FIG. 4 is preferred when the chip 10 is relatively thick in comparison to the capsule 22 and the wire or planar electrodes 24 are relatively sturdy. The structure of FIG. 5 is preferred when the chip 10 is relatively thin compared to the capsule 22, and when the wire or planar electrodes 24 are less robust than the bump electrodes 32.

INDUSTRIAL APPLICABILITY

The present invention is capable of exploitation in industry, and can be used, whenever a Z-axis module is desired, particularly when such modules are needed to process signals from a focal plane array. The present invention is capable of being made of materials and members which, taken and separate and apart from one another, are entirely conventional, or it may be made of their nonconventional counterparts.

While a particular embodiment of the present invention has been described in some detail, the true spirit and scope of the present invention are not limited thereto, but are limited only by the appended claims.

What is claimed is:

1. A plurality of capsules, each capsule comprising:
   (a) a sub-frame comprising a sheet of ceramic defining a hole sized and shaped to receive a chip, each sub-frame having a top edge and a bottom edge;
   (b) a sub-backing bonded to the sub-frame, the sub-backing comprising a sheet of ceramic, and the sub-backing being sized and shaped to conform to the sub-frame; and
   (c) a chip located in the hole and electrically connected to the sub-backing by at least one bump electrode electrically connected to the top edge and at least one other bump electrode electrically connected to the bottom edge;

the capsules being bonded together to form a module, the module having a top surface comprising the top edges of the capsules, and having a bottom surface comprising the bottom edges of the capsules.

2. A method for forming a module, the method comprising the steps of:
 (a) forming at least two capsules by a method comprising the steps of:
  (1) providing a ceramic sheet for the plurality of chips, the sheet defining a like plurality of holes sized and shaped to receive in the chips;
  (2) locating the chips in the holes;
  (3) electrically and mechanically connecting the chips to the sheet by at least one electrode per chip; and
  (4) dividing the sheet into a like plurality of sub-sheets, one sub-sheet for each chip, each sub-sheet having a top edge and a bottom edge, and the chip being electrically connected to the top edge and to the bottom edge; and
 (b) bonding the capsules together to form a module, the module having a top surface comprising the top edges of the capsules, and having a bottom surface comprising the bottom edges of the capsules.

3. A method for forming a module, the method comprising the steps of:
 (a) forming at least two capsules by a method comprising the steps of:
  (1) providing a ceramic sheet for the plurality of chips, the sheet defining a like plurality of holes sized and shaped to receive the chips;
  (2) bonding a ceramic backing to the ceramic sheet, thereby forming a sheet-backing combination:
  (3) locating the chips in the holes;
  (4) electrically connecting the chips to the combination by at least one electrode per chip; and
  (5) dividing the sheet and bonded backing into a like plurality of sub-sheets and bonded sub-backings, one sub-sheet and one sub-backing for each chip, each sub-sheet having a top edge and a bottom edge, and the chip being electrically connected to the top edge and to the bottom edge;
 each capsule comprising a respective sub-sheet, chip, and sub-backing; and
 (b) bonding the capsules together to form a module, the module having a top surface comprising the top edges of the capsules, and having a bottom surface comprising the bottom edges of the capsules.

4. The method of claim 3, wherein at least one electrode per chip, used in the step of electrically connecting the chips to the combination, is a bump electrode.

* * * * *